United States Patent
Yamamoto et al.

(10) Patent No.: US 6,486,757 B2
(45) Date of Patent: Nov. 26, 2002

(54) DOUBLE-TUNED CIRCUIT OF TUNER FEATURING RESTRAINED DEGRADATION OF SELECTIVITY

(75) Inventors: Masaki Yamamoto, Fukushima-ken (JP); Akira Yamamoto, Aomori-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/736,767

(22) Filed: Dec. 13, 2000

(65) Prior Publication Data

US 2001/0004229 A1 Jun. 21, 2001

(30) Foreign Application Priority Data

Dec. 16, 1999 (JP) .............................................. 11-357751
Jan. 24, 2000 (JP) ........................................ 2000-017952

(51) Int. Cl.[7] .................................................. H03J 5/00
(52) U.S. Cl. ................................ 334/1; 334/47; 334/60
(58) Field of Search ................................ 334/1, 47, 60

(56) References Cited

FOREIGN PATENT DOCUMENTS

| JP | 61-13708 | * | 1/1986 | ................... 334/47 |
| JP | 61-32614 | * | 2/1986 | ................... 334/47 |
| JP | 4-37306 | * | 2/1992 | ................... 334/47 |
| JP | 11-205700 | | 7/1999 | |
| JP | 11-234090 | | 8/1999 | |

* cited by examiner

Primary Examiner—Robert Pascal
Assistant Examiner—Joseph Chang
(74) Attorney, Agent, or Firm—Brinks Hofer Gilson & Lione

(57) ABSTRACT

A double-tuned circuit of a tuner that can be switched for tuning to a plurality of frequency bands by turning a switching diode ON or OFF restrains degradation of a selectivity caused by an undesirable additional tuning circuit or parasitic tuning circuit formed by a capacitance generated when the switching diode is OFF and inter-terminal capacitance of a resistor. A double-tuned circuit of a tuner is also provided that exhibits good selectivity with reduced damping to a tuning circuit in a low-band receiving mode, and also exhibits a wider tuning range. A feed resistor for high-band receiving is directly connected to a switching diode in a primary tuning circuit, and the feed resistor for high-band receiving is connected to a switching diode via a coil in a secondary tuning circuit. Hence, the tuning frequency of a parasitic tuning circuit in the primary tuning circuit is lower than the tuning frequency of a parasitic tuning circuit in the secondary tuning circuit, so that the peak of a frequency characteristic generated by the parasitic tuning circuit can be reduced. As a result, the interference with intermediate frequency signals can be reduced.

1 Claim, 7 Drawing Sheets

LB  MB  HB  TU

DOUBLE-TUNED CIRCUIT OF TUNER FEATURING RESTRAINED DEGRADATION OF SELECTIVITY

BACKGROUND OF THE INVENTION

1. Field of the Invention

The present invention relates to a high-frequency tuning circuit and, more particularly, to a double-tuned circuit of a television tuner that can be switched so as to permit tuning to multiple frequency bands.

2. Description of the Related Art

A conventional double-tuned circuit of a tuner will be described with reference to FIG. 10 through FIG. 12 and FIG. 4. Referring to FIG. 10, the double-tuned circuit is constructed by a primary tuning circuit 51 and a secondary tuning circuit 52. The primary tuning circuit 51 is constructed by a dc-blocking capacitor 53 and a varactor diode 54 connected in series, which are connected in parallel with a high-band receiving tuning coil 55, a low-band receiving tuning coil 56, a resistor 57, a coupling coil 58, and a dc-blocking capacitor 59 connected in series in the order shown in the drawing. The anode of the varactor diode 54 is grounded, and the cathode thereof is connected to the dc-blocking capacitor 53. The other end of the dc-blocking capacitor 59 is also grounded. The connection point of the dc-blocking capacitor 53 and the tuning coil 55 provides an input end of the double-tuned circuit 51, and is connected to a high-frequency amplifier 60 in the preceding stage.

Furthermore, a dc-blocking capacitor 61, a switching diode 62, and a dc-blocking capacitor 63 that are connected in series are provided between the connection point of the tuning coil 55 and the tuning coil 56, and the ground. The anode of the switching diode 62 is connected to the dc-blocking capacitor 61 and the cathode thereof is connected to the dc-blocking capacitor 63.

The connection point of the dc-blocking capacitor 61 and the switching diode 62 is connected to a high-band receiving changeover terminal 65 via a feed resistor 64.

The connection point of the switching diode 62 and the dc-blocking capacitor 63 is connected to a low-band receiving changeover terminal 67 via a feed resistor 66.

A bias resistor 68 is provided between the connection point of the switching diode 62 and the dc-blocking capacitor 63, and the ground.

The connection point of the dc-blocking capacitor 53 and the varactor diode 54 is connected to a tuning voltage terminal 70 via a feed resistor 69.

Furthermore, the secondary tuning circuit 52 is constructed by a varactor diode 71 connected in parallel to a high-band receiving tuning coil 72, a low-band receiving tuning coil 73, a resistor 74, a dc-blocking capacitor 75, the coupling ciol 58, and the dc-blocking capacitor 59 that are connected in series in the order shown in the diagram. The anode of the varactor diode 71 is grounded, and the cathode thereof is connected to the tuning coil 72. A varactor diode 76 and a dc-blocking capacitor 77 connected in series are connected to the connection point of the varactor diode 71 and the tuning coil 72. The anode of the varactor diode 76 is connected to the dc-blocking capacitor 77, and the cathode thereof is connected to the tuning coil 72. The other end of the dc-blocking capacitor 77 provides an output end of the double-tuned circuit, and is connected to a mixer 78 in the succeeding stage. The mixer 78 receives an oscillation signal from an oscillator (not shown), and outputs an intermediate frequency signal.

A dc-blocking capacitor 79 and a switching diode 80 connected in series are provided between the connection point of the tuning coil 72 and the tuning coil 73 and the connection point of the switching diode 62 and the dc-blocking capacitor 63. The anode of the switching diode 80 is connected to the dc-blocking capacitor 79, and the cathode thereof is connected to the dc-blocking capacitor 63.

The connection point of the dc-blocking capacitor 79 and the switching diode 80 is connected to the high-band receiving changeover terminal 65 via a feed resistor 81.

The connection point of the switching diode 80 and the dc-blocking capacitor 63 is connected to the low-band receiving changeover terminal 67 via the feed resistor 66.

The connection point of the varactor diode 71 and the tuning coil 72 is connected to the tuning voltage terminal 70 via a feed resistor 82.

In the configuration set forth above, a voltage is applied to the high-band receiving changeover terminal 65 or the low-band receiving changeover terminal 67 to cause the switching diode 62 and the switching diode 80 to turn ON or OFF thereby to switch the double-tuned circuit between a high-band receiving mode and a low-band receiving mode.

To switch the double-tuned circuit of the tuner shown in FIG. 10 to the mode for receiving a high-band television signal (e.g. 170 MHz to 222 MHz), a voltage of 5V, for example, is applied to the high-band receiving changeover terminal 65, while no voltage is applied to the low-band receiving changeover terminal 67. This causes a forward voltage to be applied to the switching diode 62 and the switching diode 80, and both switching diodes 62 and 80 turn ON. This in turn causes the connection point of the high-band receiving tuning coil 55 and the low-band receiving tuning coil 56 to be grounded, and also causes the connection point of the high-hand receiving tuning coil 72 and the low-band receiving tuning coil 73 to be grounded. As a result, the varactor diode 54 and the high-band receiving tuning coil 55 are interconnected in parallel in the primary tuning circuit 51, and the varactor diode 71 and the high-band receiving tuning coil 72 are interconnected in parallel in the secondary tuning circuit 52. A high-frequency equivalent circuit at that time will be the double-tuned circuit shown in FIG. 11 when the dc-blocking capacitor and the resistor are ignored, thus allowing a desired tuning frequency to be obtained by regulating the voltage applied to the varactor diodes 54 and 71.

To switch the double-tuned circuit of the tuner shown in FIG. 10 to the mode for receiving a low-band television signal (e.g. 90 MHz to 108 MHz), a voltage of 5V, for example, is applied to the low-band receiving changeover terminal 67, while no voltage is applied to the high-band receiving changeover terminal 65. This causes a reverse voltage to be applied to the switching diode 62 and the switching diode 80, and both switching diodes 62 and 80 turn OFF. As a result, the primary tuning circuit 51 turns into a parallel tuning circuit (hereinafter referred to as "the main tuning circuit") composed of the high-band receiving tuning coil 55, the low-band receiving tuning coil 56, the coupling coil 58, and the varactor diode 54. The secondary tuning circuit 52 turns into a parallel tuning circuit composed of the high-band receiving tuning coil 72, the low-band receiving tuning coil 73, the coupling coil 58, and the varactor diode 71. Thus, a desired tuning frequency can be obtained by regulating the voltage applied to the varactor diodes 54 and 71.

In the double-tuned circuit switched to the low-band receiving mode, a reverse voltage is being applied to the switching diodes 62 and 80. In general, when a reverse voltage is applied to a diode, an inter-terminal capacitance of, for example, approximately 0.2 pF is generated. The resistors 64 and 81 also have some inter-terminal capacitance. If the inter-terminal capacitance of the switching diodes 62 and 80 under the reverse voltage and the inter-terminal capacitance of the resistors 64 and 81 become no longer negligible, then the high-frequency equivalent circuit in the double-tuned circuit in the low-band receiving mode will be the double-tuned circuit shown in FIG. 12.

In the example described above, the capacitors 83, 84, 85, and 86 are respectively equivalent to the inter-terminal capacitance of the switching diode 62, the switching diode 80, the resistor 64, and the resistor 81.

Referring to FIG. 12, in the primary tuning circuit 51, the varactor diode 54, the tuning coil 55, and the capacitors 83 and 85 make up an additional tuning circuit 87 (hereinafter referred to as the "parasitic tuning circuit") separately from the main tuning circuit. Likewise, in the secondary tuning circuit 52, the varactor diode 71, the tuning coil 72, and the capacitors 84 and 86 make up a parasitic tuning circuit 88. The primary parasitic tuning circuit 87 and the secondary parasitic tuning circuit 88 share virtually the same tuning frequency. When, for example, the desired tuning frequency in the main tuning circuit is 127 MHz, the tuning frequency in the parasitic tuning circuits 87 and 88 appears in a UHF band in the range of 600 to 700 MHz.

Thus, the double-tuned circuit in the low-band receiving mode will have, for example, a frequency selectivity indicated by the solid line in FIG. 4. The frequency selectivity shows a peak owing to the tuning frequency (indicated by B in FIG. 4) of the parasitic tuning circuits 87 and 88, appearing separately from the tuning frequency (indicated by A in FIG. 4) of the main tuning circuit. The prior art has been presenting the following problem. If a signal in the tuning frequency range of the parasitic tuning circuits 87 and 88 is applied to the mixer 78 connected to the output end of the double-tuned circuit and mixed with an oscillation signal by the mixer 78, then the signal generated based on a sum of or a difference between an N-multiple of the frequency of an oscillation signal and the frequency of a signal at a tuning frequency of the parasitic tuning circuits 87 and 88 interferes with an intermediate frequency signal (54 MHz to 60 MHz), which is output from the mixer 78.

To be more specific, if, for example, the tuning frequency of the main tuning circuit is 127 MHz, then the frequency of an oscillation signal will be 184 MHz, which is higher than the tuning frequency of the main tuning circuit by 57 MHz. Hence, the frequency 57 MHz is output from the mixer 78, the frequency 57 MHz representing the difference between 552 MHz, which is the frequency that is three times the frequency 184 MHz, and 609 MHz, which is the tuning frequency of the parasitic tuning circuits.

Referring back to FIG. 10, in order for the primary tuning circuit 51 and the secondary tuning circuit 52 to share the same magnitude of Q in the high-band receiving mode, equivalent current must be supplied to the switching diode 62 and the switching diode 80. This requires that the resistance values of the resistor 64 and the resistor 81 be the same. Furthermore, the DC resistance values of the switching diodes 62 and 80 must be reduced by passing current of 0.5 to 1.0 mA through the switching diodes 62 and 80. For this reason, the resistance values of the resistors 64 and 81 will be, for example, approximately 1 KΩ, and it has been impossible to set any larger resistance values.

Referring now to FIG. 12 illustrating the low-band receiving mode, the resistors 64 and 81 that function to ground the cathodes of the switching diodes DC-wise when the diodes turn OFF are connected in parallel to the low-band receiving coils 56 and 73. As previously mentioned, small inter-terminal capacitance is present between the electrodes of the resistors 64 and 81, and the capacitance is connected in parallel to the varactor diodes 54 and 71, resulting in a reduced variable range of tuning frequency. Furthermore, the resistance values of the resistors 64 and 81 could not be increased more than, for example, approximately 1 KΩ. Hence, the resistors 64 and 81 serve as parallel dampers for the tuning circuits 51 and 52, resulting in a lower gain.

FIG. 9 is a graph demonstrating the gain characteristics of a tuner employing a high-frequency tuning circuit in accordance with the present invention and a tuner employing a conventional high-frequency tuning circuit. Solid line A indicates the characteristic of a conventional example observed when the resistance values of both the resistors 64 and 81 are set to 1 KΩ. As can be seen from solid line A of FIG. 9, the general gain drops, the gain of channel B of the maximum frequency in the low-band range showing a significant drop.

SUMMARY OF THE INVENTION

The present invention has been made with a view toward solving the problems described above, and it is a first object of the present invention to provide a double-tuned circuit of a tuner that exhibits a good selectivity that reduces the influences of parasitic tuning circuits 87 and 88 additionally constructed by inter-terminal capacitors 83 and 84 when the switching diodes 62 and 80 are OFF in the low-band receiving mode and the inter-terminal capacitors 85 and 86 of the resistors 64 and 81.

It is a second object of the present invention to provide a double-tuned circuit that exhibits a good selectivity in which damping relative to a tuning circuit in the low-band receiving mode is lessened, and to provide a double-tuned circuit that has a wider tuning range.

To these ends, according to one aspect of the present invention, there is provided a double-tuned circuit of a tuner, including: a primary tuning circuit; a secondary tuning circuit; and first and second band selecting terminals for applying a changeover voltage for switching the primary tuning circuit and the secondary tuning circuit to a low-band television signal receiving mode or a high-band television signal receiving mode, wherein each of the primary tuning circuit and the secondary tuning circuit has a varactor diode, a high-band receiving coil and a low-band receiving coil connected in series at each end thereof, and a switching diode connected high-frequency-wise between the connection point of the high-band receiving coil and the low-band receiving coil and ground; the varactor diode is connected in parallel to the high-band receiving coil and the low-band receiving coil connected in series, and the other end of the low-band receiving coil is grounded high-frequency-wise; one end of each switching diode grounded high-frequency-wise is connected to the first band selecting terminal DC-wise; the other end of the switching diode of one of the primary tuning circuit or the secondary tuning circuit is connected to the second band selecting terminal via a first resistor; and the other end of the switching diode of the other tuning circuit is connected to the second band selecting terminal DC-wise via the low-band receiving coil.

In a preferred form of the double-tuned circuit of a tuner in accordance with the present invention, the other end of the switching diode of the other tuning circuit is connected to the second band selecting terminal via the low-band receiving coil and the first resistor in series.

According to another aspect of the present invention, there is provided a double-tuned circuit of a tuner, including: a primary tuning circuit; a secondary tuning circuit; and first and second band selecting terminals, wherein each of the primary tuning circuit and the secondary tuning circuit has a varactor diode, a high-band receiving coil and a low-band receiving coil connected in series at their one end, and a switching diode that is provided between the connection point of the high-band receiving coil and the low-band receiving coil and the ground and has one end thereof grounded high-frequency-wise; the varactor diode is connected in parallel to the high-band receiving coil and the low-band receiving coil connected in series in each of the primary tuning circuit and the secondary tuning circuit, and the other end of the low-band receiving coil is grounded high-frequency-wise; one of each of the switching diodes is connected DC-wise to the first band selecting terminal and grounded via a second resistor, and the other end thereof is connected the second band selecting terminal via the low-band receiving coil and a third resistor in series; and the second band selecting terminal is grounded via a fourth resistor.

According to yet another aspect of the present invention, there is provided a double-tuned circuit of a tuner, including: a primary tuning circuit; a secondary tuning circuit; and first and second band selecting terminals, wherein each of the primary tuning circuit and the secondary tuning circuit has a varactor diode, a high-band receiving coil and a low-band receiving coil connected in series at their one end, and a switching diode that is provided between the connection point of the high-band receiving coil and the low-band receiving coil and the ground and has one end thereof grounded high-frequency-wise; the varactor diode is connected in parallel to the high-band receiving coil and the low-band receiving coil connected in series in each of the primary tuning circuit and the secondary tuning circuit, and the other end of the low-band receiving coil is grounded high-frequency-wise; the other end of each low-band receiving coil is isolated DC-wise; one of each of the switching diodes is connected to the first band selecting terminal DC-wise and grounded via a fifth resistor, and the other end thereof is connected the second band selecting terminal via a sixth resistor; and the other end of the switching diode of either the primary tuning circuit or the secondary tuning circuit is connected DC-wise to the second band selecting terminal via the low-band receiving coil and a seventh resistor.

DESCRIPTION OF THE PREFERRED EMBODIMENTS

Referring to FIG. 1 through FIG. 9, the embodiments of the double-tuned circuit of a tuner in accordance with the present invention will be described.

Figure 1:
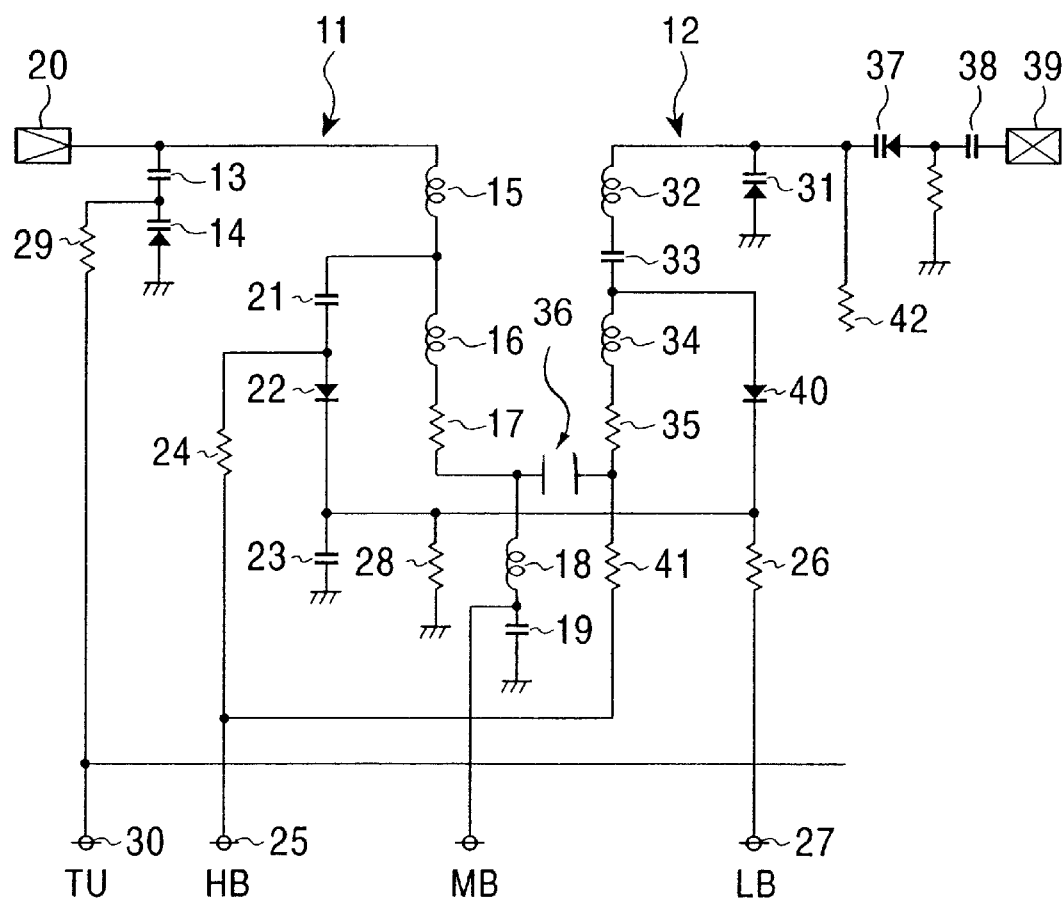
FIG. 1 is a circuit diagram of a first embodiment of a double-tuned circuit of a tuner in accordance with the present invention.
Figure 2:
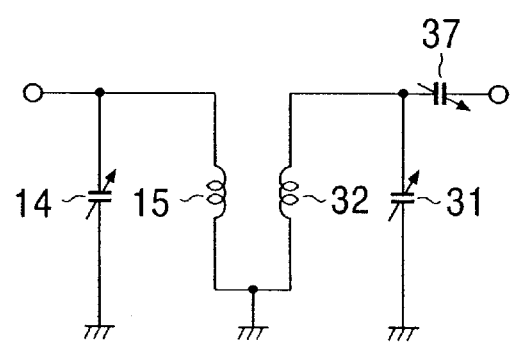
FIG. 2 is a diagram showing an equivalent circuit of the double-tuned circuit of a tuner in accordance with the present invention in a high-band receiving mode.

FIG. 1 is a circuit diagram of a first embodiment of the double-tuned circuit of a tuner according to the present invention. The double-tuned circuit of a tuner in accordance with the present invention is constituted by a primary tuning circuit 11, a secondary tuning circuit 12, a first band selecting terminal 27, and a second band selecting terminal 25. The first band selecting terminal 27 is subjected to a changeover voltage for switching the primary tuning circuit 11 and the secondary tuning circuit 12 to a low-band television signal receiving mode. The second band selecting terminal 25 is subjected to a changeover voltage for switching the primary tuning circuit 11 and the secondary tuning circuit 12 to a high-band television signal receiving mode.

The primary tuning circuit 11 is constructed by a dc-blocking capacitor 13 and a varactor diode 14 interconnected in series, which are connected in parallel with a high-band receiving tuning coil 15, a low-band receiving tuning coil 16, a damping resistor 17, a coupling coil 18, and a dc-blocking capacitor 19 connected in series in the order shown in the drawing. The anode of the varactor diode 14 is grounded, and the cathode thereof is connected to the dc-blocking capacitor 13. The other end of the dc-blocking capacitor 19 is also grounded. The connection point of the dc-blocking capacitor 13 and the tuning coil 15 provides an input end of the primary tuning circuit 11, and is connected to a high-frequency amplifier 20 in the preceding stage.

A dc-blocking capacitor 21, a switching diode 22, and a dc-blocking capacitor 23 that are connected in series are provided between the connection point of the tuning coil 15 and the tuning coil 16, and the ground. One end (e.g. the cathode) of the switching diode 22 is connected to the ground via the dc-blocking capacitor 23, so that it is grounded high-frequency-wise.

The connection point of the switching diode 22 and the dc-blocking capacitor 23 is connected via a feed resistor 26 to a first band selecting terminal 27 for low-band receiving. In other words, the terminal of the switching diode 22 that is grounded high-frequency-wise is connected to the band selecting terminal 27 DC-wise.

The connection point of the dc-blocking capacitor 21 and the switching diode 22 is connected via a feed resistor 24 to a second band selecting terminal 25 for high-band receiving. In other words, the end of the switching diode 22 that is not grounded high-frequency-wise is connected via the resistor 24 to the band selecting terminal 25 DC-wise.

A bias resistor 28 is provided between the connection point of the switching diode 22 and the dc-blocking capacitor 23, and the ground.

The connection point of the dc-blocking capacitor 13 and the varactor diode 14 is connected to a tuning voltage terminal 30 via a feed resistor 29.

Furthermore, the secondary tuning circuit 12 is constructed by a varactor diode 31 connected in parallel to a high-band receiving tuning coil 32, a dc-blocking capacitor 33, a low-band receiving tuning coil 34, a damping resistor 35, a dc-blocking capacitor 36, the coupling coil 18, and the dc-blocking capacitor 19 that are connected in series in the order shown in the diagram. The anode of the varactor diode 31 is grounded, and the cathode thereof is connected to the tuning coil 32. A varactor diode 37 and a dc-blocking capacitor 38 interconnected in series are connected to the connection point of the varactor diode 31 and the tuning coil 32. The anode of the varactor diode 37 is connected to the dc-blocking capacitor 38, while the cathode thereof is connected to the tuning coil 32. The other end of the dc-blocking capacitor 38 provides an output end of the double-tuned circuit, and is connected to a mixer 39 in the succeeding stage. The mixer 39 receives an oscillation signal from an oscillator (not shown), and outputs an intermediate frequency signal.

A switching diode 40 is provided between the connection point of the dc-blocking capacitor 33 and the tuning coil 34 and the connection point of the switching diode 22 and the dc-blocking capacitor 23. One end (e.g. the cathode) of the switching diode 40 is connected to the ground via the dc-blocking capacitor 23, so that it is grounded high-frequency-wise.

The connection point of the resistor 35 and the dc-blocking capacitor 36 is connected via a feed resistor 41 to the selecting terminal 25 for high-band receiving. The feed resistor 41 serves as the feed resistor connected to the anode of the switching diode 40. In other words, unlike the switching diode 22 in the primary tuning circuit 11, the other end (anode) of the switching diode 40 in the secondary tuning circuit 12 is connected DC-wise to the band selecting terminal 25 via the low-band receiving tuning coil 34 and the resistor 41 in series.

Furthermore, one end of the switching diode 40 is connected via a feed resistor 26 to the selecting terminal 27 for low-band receiving. In other words, the end of the switching diode 40 that is grounded high-frequency-wise is connected DC-wise to the band selecting terminal 27.

The connection point of the varactor diode 31 and the tuning coil 32 is connected to the tuning voltage terminal 30 via a feed resistor 42.

In the configuration set forth above, a band changeover voltage is applied to the selecting terminal 25 for high-band receiving or the selecting terminal 27 for low-band receiving to cause the switching diode 22 and the switching diode 40 to turn ON or OFF thereby to switch the double-tuned circuit between a high-band receiving mode and a low-band receiving mode.

To switch the double-tuned circuit of the tuner shown in FIG. 1 to the mode for receiving a high-band television signal (e.g. 170 MHz to 222 MHz), a voltage of 5V, for example, is applied to the selecting terminal 25 for high-band receiving, while no changeover voltage is applied to the selecting terminal 27 for low-band receiving. This causes a forward voltage to be applied to the switching diode 22 and the switching diode 40, and both switching diodes 22 and 40 turn ON. This in turn causes the connection point of the high-band receiving tuning coil 15 and the low-band receiving tuning coil 16 to be grounded high-frequency-wise, and also causes the connection point of the dc-blocking capacitor 33 and the low-band receiving tuning coil 34 to be grounded high-frequency-wise. As a result, the varactor diode 14 and the high-band receiving tuning coil 15 are interconnected in parallel in the primary tuning circuit 11, and the varactor diode 31 and the high-band receiving tuning coil 32 are interconnected in parallel in the secondary tuning circuit 12. A high-frequency equivalent circuit at that time will be the double-tuned circuit shown in FIG. 2 when the dc-blocking capacitor and the resistor are ignored, thus allowing a desired tuning frequency to be obtained by regulating the tuning voltage applied to the varactor diodes 14 and 31.

To switch the double-tuned circuit of the tuner to the mode for receiving a low-band television signal (e.g. 90 MHz to 108 MHz), a changeover voltage of 5V, for example, is applied to the selecting terminal 27 for low-band receiving, while no changeover voltage is applied to the selecting terminal 25 for high-band receiving. This causes a reverse voltage to be applied to the switching diode 22 and the switching diode 40, and both switching diodes 22 and 40 turn OFF. As a result, the primary tuning circuit 11 turns into a parallel tuning circuit (hereinafter referred to as "the main tuning circuit") composed of the high-band receiving tuning coil 15, the low-band receiving tuning coil 16, the coupling coil 18, and the varactor diode 14. The secondary tuning circuit 12 turns into a parallel tuning circuit (a main tuning circuit) composed of the high-band receiving tuning coil 32, the low-band receiving tuning coil 34, the coupling coil 18, and the varactor diode 31. Thus, a desired tuning frequency can be obtained by regulating the tuning voltage applied to the varactor diodes 14 and 31.

In the double-tuned circuit switched to the low-band receiving mode, a reverse voltage is being applied to the switching diodes 22 and 40. In general, when a reverse voltage is applied to a diode, an inter-terminal capacitance of, for example, approximately 0.2 pF is generated. The feed resistors 24 and 41 also have some inter-terminal capacitance. If the inter-terminal capacitance of the switching diodes 22 and 40 under the reverse voltage, and the inter-terminal capacitance of the feed resistors 24 and 41 become no longer negligible, then the high-frequency equivalent circuit in the double-tuned circuit in the low-band receiving mode will be the double-tuned circuit shown in FIG. 3.

In the example described above, the capacitors 43, 44, 45, and 46 are respectively equivalent to the inter-terminal capacitance of the switching diode 22, the switching diode 40, the resistor 24, and the resistor 41.

Figure 3:
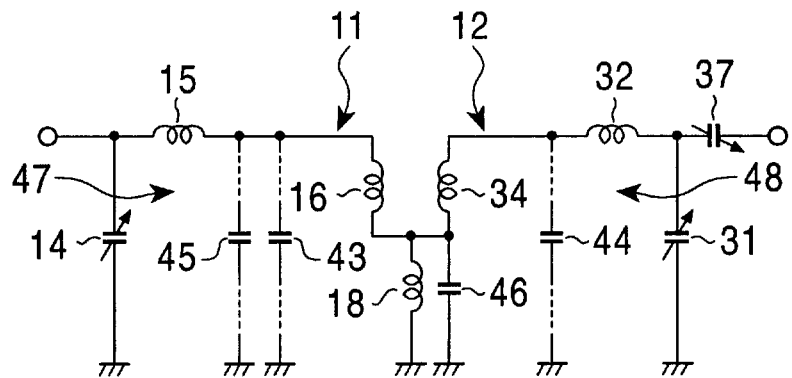
FIG. 3 is a diagram showing an equivalent circuit of the double-tuned circuit of a tuner in accordance with the present invention in a low-band receiving mode.

Referring to FIG. 3, in the primary tuning circuit 11, the varactor diode 14, the tuning coil 15, and the capacitors 43 and 45 make up an additional tuning circuit 47 (hereinafter referred to as the "parasitic tuning circuit") separately from the main tuning circuit. Likewise, in the secondary tuning circuit 12, the varactor diode 31, the tuning coil 32, and the capacitors 44 and 46 make up a parasitic tuning circuit 48. When, for example, the desired tuning frequency in the main tuning circuit is 127 MHz, the tuning frequency in the parasitic tuning circuits 47 and 48 appears in a UHF band in the range of 600 to 700 MHz.

Referring to FIG. 3, comparison of the parasitic tuning circuit 47 and the parasitic tuning circuit 48 reveals the following. The capacitors 43 and 44 share virtually the same capacitance; however, the capacitance of the capacitor 43 and that of the capacitor 45 in the parasitic tuning circuit 47 will be summed as a resulting capacitance. It is obvious, therefore, that the resulting capacitance will be larger than the capacitance of the capacitor 44 of the parasitic tuning circuit 48. If the capacitance of the varactor diode 14 and the capacitance of the varactor diode 31 are set equal, and the inductance of the tuning coil 15 and the inductance of the tuning coil 32 are also set equal, then the tuning frequency of the parasitic tuning circuit 47 will be lower than the tuning frequency of the parasitic tuning circuit 48 because the resulting capacitance of the capacitor 43 and the capacitor 45 is larger than the capacitance of the capacitor 44. This means that the tuning frequency of the parasitic tuning circuit 48 is not the same as the tuning frequency of the parasitic tuning circuit 47; it is slightly higher.

Figure 4:
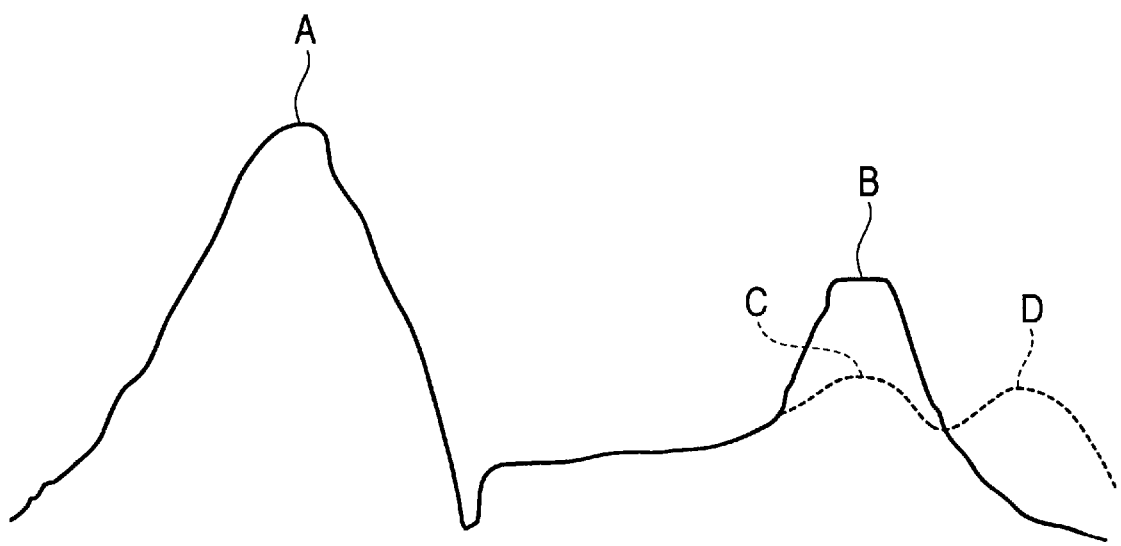
FIG. 4 is a diagram showing the selectivities of inventive and conventional double-tuned circuits of tuners in the low-band receiving mode.

Therefore, the double-tuned circuit in the low-band receiving mode will exhibit, for example, the frequency selectivity as indicated by the dashed line of FIG. 4. When the tuning frequency of the main tuning circuit is 127 MHz (indicated by portion A of FIG. 4), then there will be two peaks, namely, the peak of the parasitic tuning circuit 47 indicated by portion C of FIG. 4, and the peak of the parasitic tuning circuit 48 indicated by portion D of FIG. 4. More specifically, as compared with portion B of FIG. 4 that indicates the conventional peak, the magnitude of the peak of the parasitic tuning circuit 47 indicated by portion C of FIG. 4 is smaller at the same frequency, and the peak of the parasitic tuning circuit 48 indicated by portion D of FIG. 4 appears at a lightly higher frequency and is also smaller. Thus, fewer signals will be produced that interfere with the intermediate frequency signals (54 MHz to 60 MHz), which are the outputs from the mixer 39 in the succeeding stage.

Figure 5:
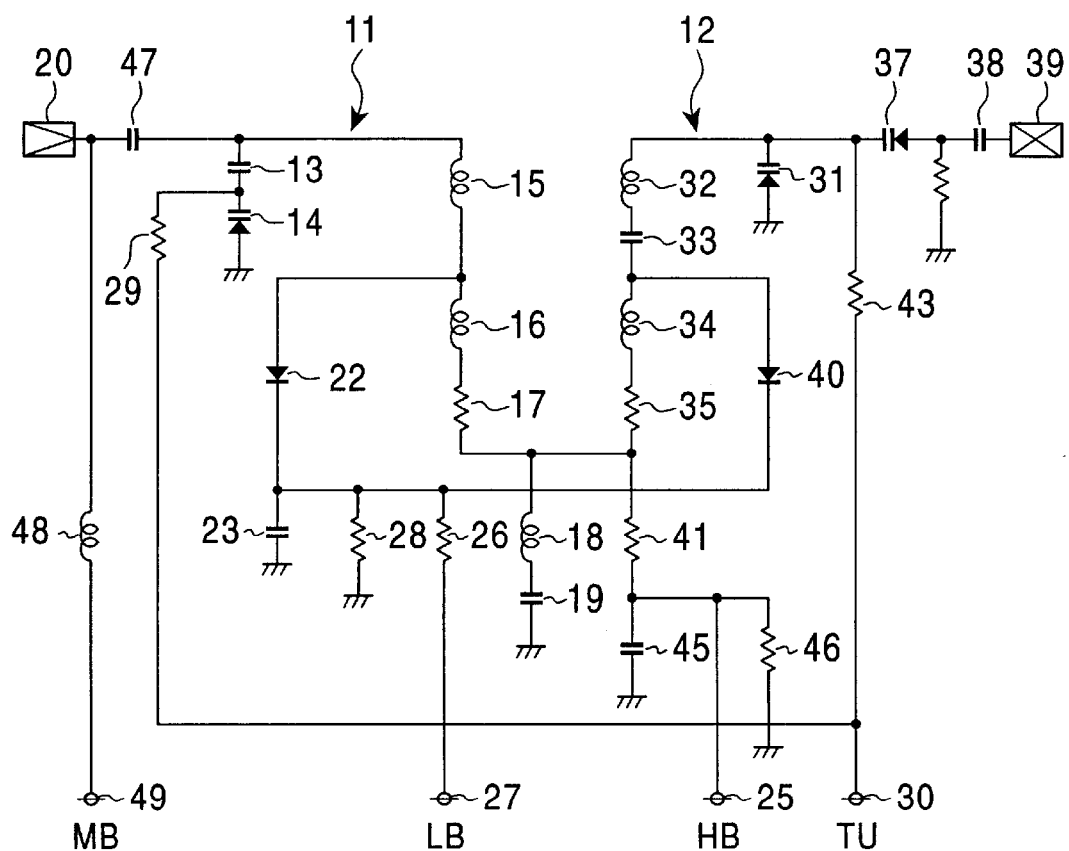
FIG. 5 is a circuit diagram of a second embodiment of the double-tuned circuit of a tuner in accordance with the present invention.

FIG. 5 is a circuit diagram demonstrating a second embodiment of a high-frequency tuning circuit in accordance with the present invention. The second embodiment is constituted by a primary tuning circuit 11, a secondary tuning circuit 12, a first band selecting terminal 27, and a second band selecting terminal 25. The first band selecting terminal 27 is subjected to a changeover voltage for switching the primary tuning circuit 11 and the secondary tuning circuit 12 to a low-band television signal receiving mode. The second band selecting terminal 25 is subjected to a changeover voltage for switching the primary tuning circuit 11 and the secondary tuning circuit 12 to a high-band television signal receiving mode.

The primary tuning circuit 11 is constructed by a dc-blocking capacitor 13 and a varactor diode 14 interconnected in series, which are connected in parallel with a high-band receiving tuning coil 15, a low-band receiving tuning coil 16, a damping resistor 17, a coupling coil 18, and a dc-blocking capacitor 19 connected in series in the order shown in the drawing. The anode of the varactor diode 14 is grounded, and the cathode thereof is connected to the dc-blocking capacitor 13. The other end of the dc-blocking capacitor 19 is also grounded. The connection point of the dc-blocking capacitor 13 and the tuning coil 15 provides an input end of the primary tuning circuit 11, and is connected to a high-frequency amplifier 20 in the preceding stage via a dc-blocking capacitor 47. The high-frequency amplifier 20 receives DC power through a power supply terminal 49 via a coil 48.

A switching diode 22 and a dc-blocking capacitor 23 connected in series are provided between the connection point of the tuning coil 15 and a tuning coil 16 and the ground. The cathode of the switching diode 22 is connected to the dc-blocking capacitor 23. The cathode of the switching diode 22 is connected to the low-band receiving band selecting terminal 27 via a feed resistor 26 and also grounded via a first resistor 28 for biasing. The anode of the switching diode 22 is connected to a band selecting terminal 25 via the tuning coil 16, a resistor 17, and a second resistor 41 for power feeding. The cathode of the varactor diode 14 is connected to a tuning voltage terminal 30 via a feed resistor 29.

The secondary tuning circuit 12 is constructed by a varactor diode 31 that is connected to a high-band receiving tuning coil 32, a dc-blocking capacitor 33, a low-band receiving tuning coil 34, a damping resistor 35, the coupling coil 18, and the dc-blocking capacitor 19 that are connected in series in the order shown in the diagram, the varactor diode 31 being connected to the above components in parallel relative to the ground. The anode of the varactor diode 31 is grounded, and the cathode thereof is connected to the tuning coil 32. A varactor diode 37 and a dc-blocking capacitor 38 interconnected in series are connected to the cathode of the varactor diode 31. The anode of the varactor diode 37 is connected to the dc-blocking capacitor 38, while the cathode thereof is connected to the tuning coil 32. The other end of the dc-blocking capacitor 38 provides an output end of the high-frequency tuning circuit, and is connected to a mixer 39 in the succeeding stage. The mixer 39 receives an oscillation signal from an oscillator (not shown), and outputs an intermediate frequency signal.

A switching diode 40 is provided between the connection point of the dc-blocking capacitor 33 and the tuning coil 34 and the cathode of the switching diode 22. The cathode of the switching diode 40 is connected to the dc-blocking capacitor 23. The cathode of the varactor diode 31 is connected to the tuning voltage terminal 30 via a feed resistor 43. The selecting terminal 25 for high-band receiving is grounded via a third resistor 46 for biasing and also grounded via a dc-blocking capacitor 45.

To switch the high-frequency tuning circuit shown in FIG. 5 to the mode for receiving a high-band television signal, a changeover voltage of 5V, for example, is applied to the selecting terminal 25 for high-band receiving, while no changeover voltage is applied to the selecting terminal 27 for low-band receiving. This causes a forward voltage to be applied to the switching diode 22 and the switching diode 40, and both switching diodes 22 and 40 turn ON. This in turn causes the connection point of the high-band receiving tuning coil 15 and the low-band receiving tuning coil 16 to be grounded high-frequency-wise, and also causes the connection point of the dc-blocking capacitor 33 and the low-band receiving tuning coil 34 to be grounded high-frequency-wise. A desired tuning frequency can be obtained by regulating the tuning voltage applied to the varactor diodes 14 and 31.

To switch the high-frequency tuning circuit to the mode for receiving a low-band television signal, a changeover voltage of 5V, for example, is applied to the selecting terminal 27 for low-band receiving, while no changeover voltage is applied to the selecting terminal 25 for high-band receiving. This causes a reverse voltage to be applied to the switching diode 22 and the switching diode 40, and both switching diodes 22 and 40 turn OFF. As a result, a high-frequency equivalent circuit in the low-band receiving mode will be the high-frequency tuning circuit shown in FIG. 6 when the tuning coil for high-band receiving and the dc-blocking capacitor are ignored because the tuning coil for high-band receiving is extremely smaller than the tuning coil for low-band receiving. Thus, a desired tuning frequency can be obtained by regulating the tuning voltage applied to the varactor diodes 14 and 31.

Figure 6:
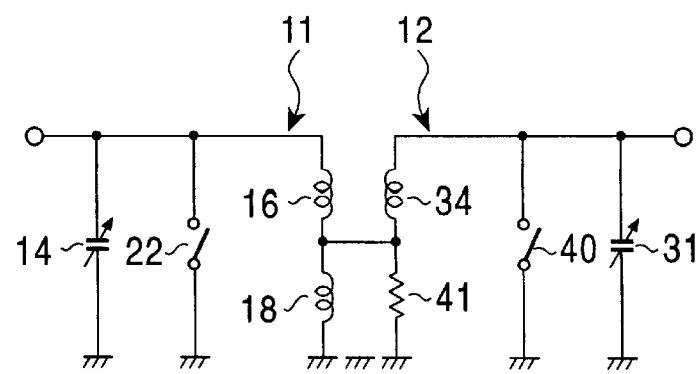
FIG. 6 is a diagram showing an equivalent circuit of the second embodiment of the double-tuned circuit of a tuner in accordance with the present invention in the low-band receiving mode.

Referring to FIG. 6, a feed resistor 41 is connected to the anodes of the switching diodes 22 and 40 via the tuning coil 16 and the tuning coil 34. The feed resistor, therefore, does not become a damper to the tuning circuits 11 and 12, making it possible to restrain a drop in gain. Moreover, the inter-terminal capacitance of the feed resistor 41 does not affect the variable range of tuning frequencies, allowing a wider tuning range to be achieved.

Figure 9:
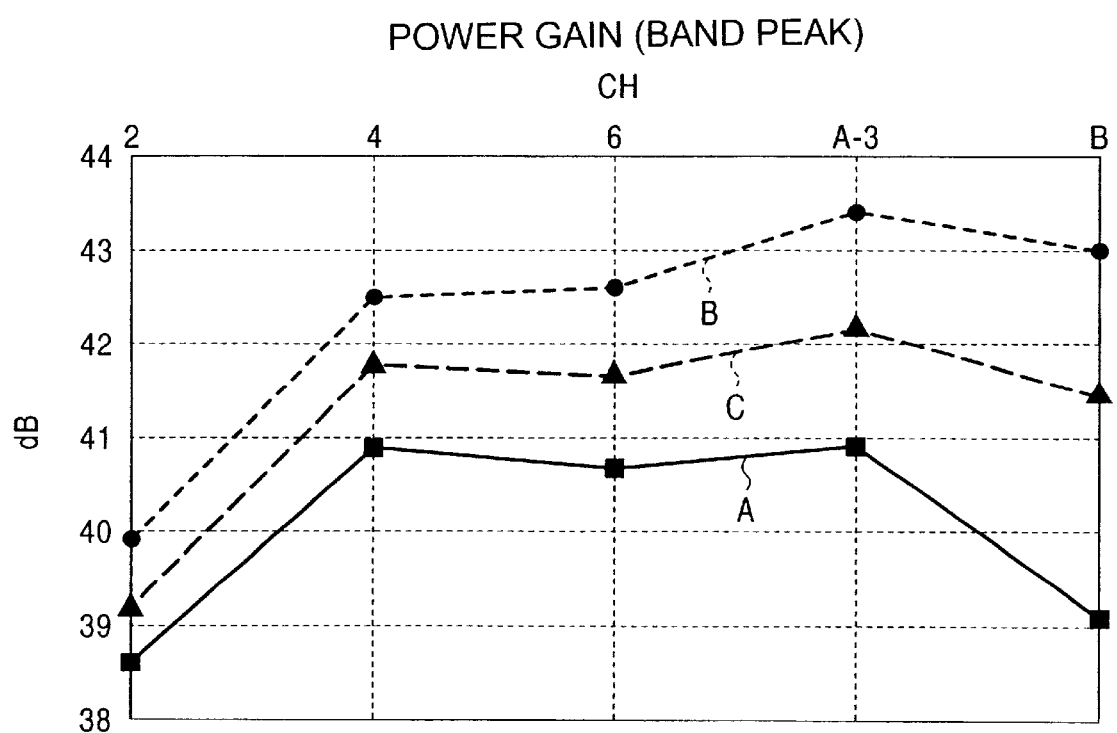
FIG. 9 is a gain characteristic diagram showing a comparison of a tuner that employs the double-tuned circuit of a tuner in accordance with the present invention and a tuner that employs a conventional double-tuned circuit of a tuner.
Figure 10:
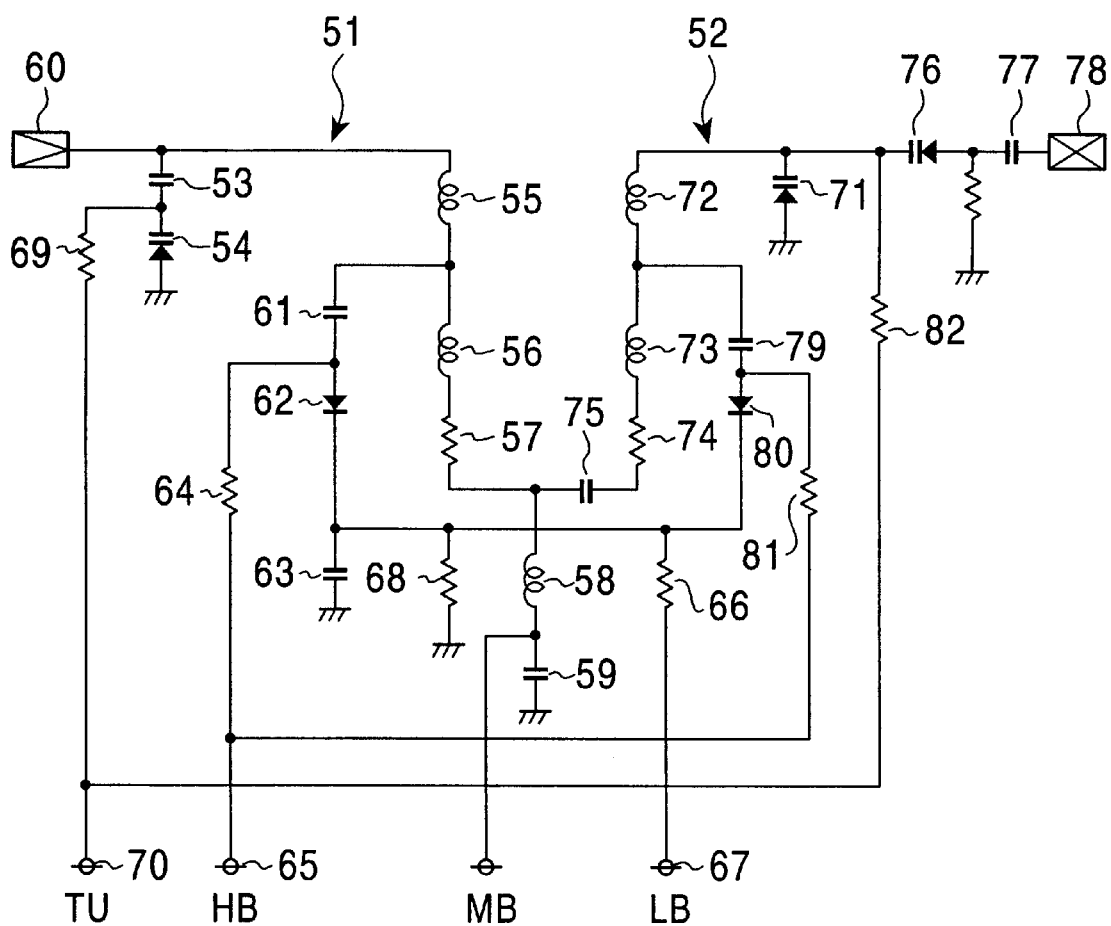
FIG. 10 is a circuit diagram of the conventional double-tuned circuit of a tuner.
Figure 11:
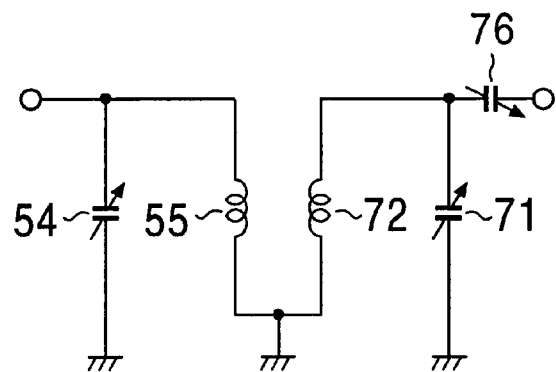
FIG. 11 is a diagram showing an equivalent circuit of the conventional double-tuned circuit of a tuner in a high-band receiving mode.
Figure 12:
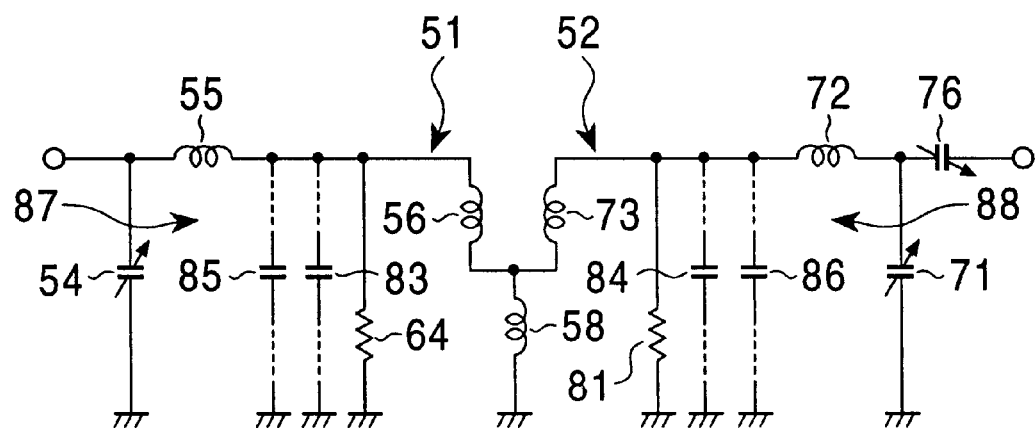
FIG. 12 is a diagram showing an equivalent circuit of the conventional double-tuned circuit of a tuner in the low-band receiving mode.

Dotted line B shown in FIG. 9 represents a characteristic obtained when the resistor 41 in the second embodiment is set to 1 KΩ. Dotted line B shows that the gain can be increased by about 2 to 3 dB as a whole as compared with the conventional example indicated by solid line A. In particular, the gain of channel B, which has the highest frequency in low band, shows a significant improvement, namely, an increase of about 4 dB.

Figure 7:
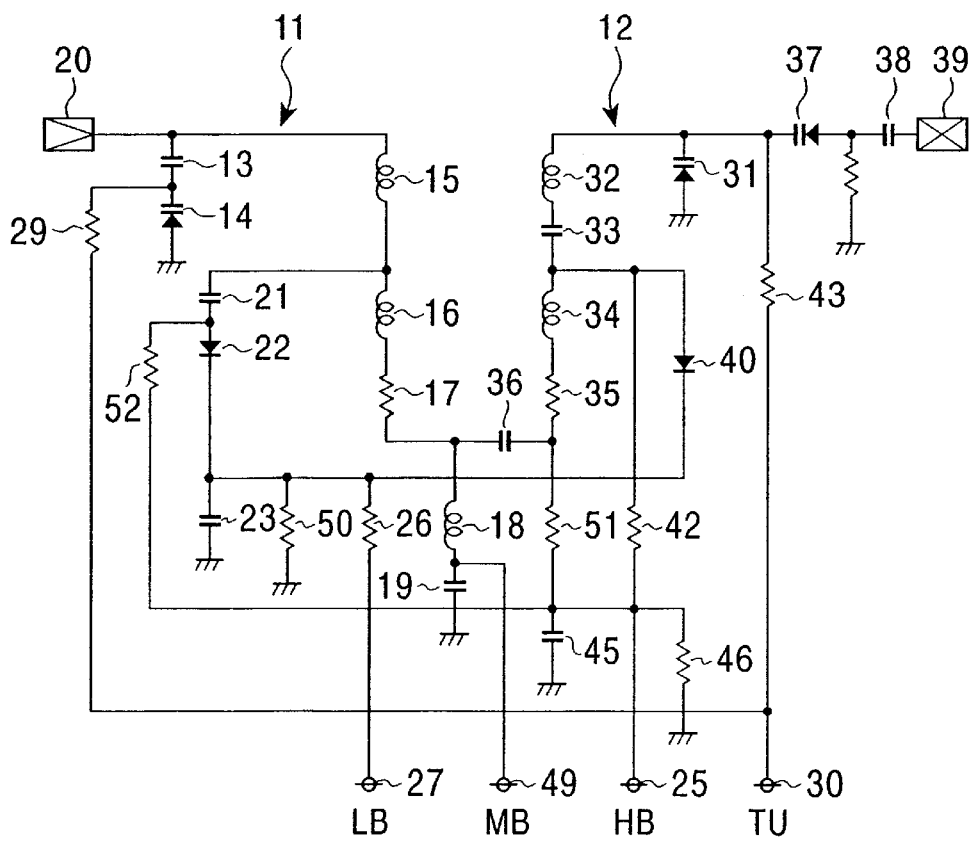
FIG. 7 is a circuit diagram of a third embodiment of the double-tuned circuit of a tuner in accordance with the present invention.

FIG. 7 is a circuit diagram demonstrating a third embodiment of a high-frequency tuning circuit in accordance with the present invention. In FIG. 7, the components equivalent to those in FIG. 1 showing the second embodiment will be assigned the like reference numerals and detailed descriptions thereof will be omitted.

In the third embodiment, the other ends of low-band receiving coils 16 and 34 are isolated DC-wise by a dc-blocking capacitor 36. A high-frequency amplifier 20 receives DC power through a power supply terminal 49 via a coil 15, a coil 16, a resistor 17, and a coil 18.

A dc-blocking capacitor 21 is provided between the connection point of the tuning coil 15 and the tuning coil 16 and the anode of a switching diode 22.

The cathodes of the switching diode 22 and a switching diode 40 are grounded via a fifth resistor 50. The resistor 50 corresponds to the resistor 28 of the second embodiment.

The anodes of the switching diodes 22 and 40 are respectively connected to a band selecting terminal 25 via sixth resistors 52 and 42 for power feed.

The anode of the switching diode 40 is connected to the band selecting terminal 25 via a tuning coil 34, a resistor 35, and a seventh resistor 51 for power feed. The resistor 51 corresponds to the resistor 41 of the second embodiment.

The dc-blocking capacitor 36 isolates a power feed terminal 49 from the switching diode 40 DC-wise, and isolates the selecting terminal 25 from the high-frequency amplifier 20 DC-wise.

Figure 8:
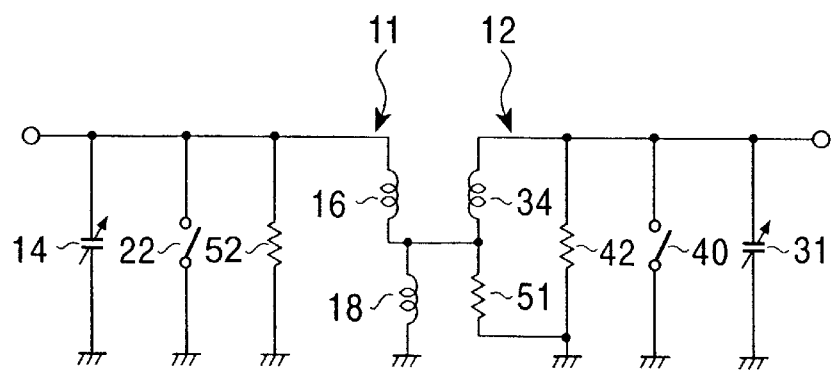
FIG. 8 is a diagram showing an equivalent circuit of the third embodiment of the double-tuned circuit of a tuner in accordance with the present invention in the low-band receiving mode.

A high-frequency equivalent circuit in a low-band receiving mode will be the high-frequency tuning circuit shown in FIG. 8 when the tuning coil for high-band receiving and the dc-blocking capacitor are ignored because the tuning coil for high-band receiving is extremely smaller than the tuning coil for low-band receiving.

Referring to FIG. 7, the resistors 42 and 51 in the tuning circuit 12 are connected in parallel via the tuning coil 34, so that the resistance values of the resistors 42 and 51 can be increased without reducing current. The resistance values of both resistors 42 and 51 can be set to, for example, 2 KΩ, thus making it possible to reduce damping to the tuning circuit 12. Moreover, since the resistors 42 and 51 are connected in parallel via the tuning coil 34, a wider tuning range can be accomplished.

Referring to FIG. 9, dashed line C represents a characteristic obtained when both resistors 42 and 51 are set to 2 KΩ in the third embodiment. As a result, the gain can be increased by about 1 dB as a whole as compared with the conventional example indicated by solid line A. In particular, the gain of channel B, which has the highest frequency in low band, shows a significant improvement, namely, an increase of about 2.5 dB. The third embodiment exhibits good characteristics in which the differences in gain between channels are reduced, although the improvement in gain is smaller than that illustrated by dotted line B of the second embodiment.

Thus, according to the present invention, a feed resistor for high-band receiving is directly connected to a switching diode in a primary tuning circuit, and a feed resistor for high-band receiving is connected to a switching diode via a low-band receiving coil in a secondary tuning circuit. With this arrangement, when a parasitic tuning circuit is created by the inter-terminal capacitance generated when the switching diode is OFF and the inter-terminal capacitance of the resistor, the tuning frequency of a parasitic tuning circuit in the primary tuning circuit is lower than the tuning frequency of a parasitic tuning circuit in the secondary tuning circuit, so that the peak of a frequency characteristic generated by the parasitic tuning circuit can be divided into two peaks. This makes it possible to reduce the peak of a frequency characteristic, thus allowing interference with intermediate frequency signals to be reduced.

Furthermore, a double-tuned circuit of a tuner in accordance with the present invention includes: a primary tuning circuit; a secondary tuning circuit; and first and second band selecting terminals, wherein each of the primary tuning circuit and the secondary tuning circuit has a varactor diode, a high-band receiving coil and a low-band receiving coil connected in series at each end thereof, and a switching diode that is provided between the connection point of the high-band receiving coil and the low-band receiving coil and ground and has one end thereof grounded high-frequency-wise; the varactor diode is connected in parallel to the high-band receiving coil and the low-band receiving coil connected in series, and the other end of the low-band receiving coil is grounded high-frequency-wise in the primary tuning circuit and the secondary tuning circuit; one end of each switching diode is connected DC-wise to the first band selecting terminal and grounded via a second resistor, and the other end thereof is connected to the second band selecting terminal via the low-band receiving coil and a third resistor in series; and the second band selecting terminal is grounded via a fourth resistor. With this arrangement, a feed resistor is connected to a switching diode via a tuning coil, so that a wider tuning range can be accomplished, and a better selectivity free from interference as a parallel damper can be achieved.

A double-tuned circuit of a tuner in accordance with the present invention includes: a primary tuning circuit; a secondary tuning circuit; and first and second band selecting terminals, wherein each of the primary tuning circuit and the secondary tuning circuit has a varactor diode, a high-band receiving coil and a low-band receiving coil connected in series at their one end, and a switching diode that is provided between the connection point of the high-band receiving coil and the low-band receiving coil and the ground and has one end thereof grounded high-frequency-wise; the varactor diode is connected in parallel to the high-band receiving coil and the low-band receiving coil connected in series in each of the primary tuning circuit and the secondary tuning circuit, and the other end of the low-band receiving coil is grounded high-frequency-wise; the other end of each low-band receiving coil is isolated DC-wise; one of each of the switching diodes is connected to the first band selecting terminal DC-wise and grounded via a fifth resistor, and the other end thereof is connected the second band selecting terminal via a sixth resistor; and the other end of the switching diode of either the primary tuning circuit or the secondary tuning circuit is connected DC-wise to the second band selecting terminal via the low-band receiving coil and a seventh resistor. With this arrangement, a feed resistor is connected in parallel to only one tuning circuit, making it possible to provide a wider tuning range and also to provide a better selectivity with less interference as a parallel damper.

What is claimed is:

1. A double-tuned circuit of a tuner, comprising:
   a primary tuning circuit;
   a secondary tuning circuit; and
   first and second band selecting terminals to apply a changeover voltage that switches the primary tuning circuit and the secondary tuning circuit to a low-band television signal receiving mode or a high-band television signal receiving mode,
   wherein each of the primary tuning circuit and the secondary tuning circuit has:
      a varactor diode;
      a high-band receiving coil and a low-band receiving coil each having a first end and a second end and connected in series at the first end thereof; and
      a switching diode having a first end and a second end, the first end of the switching diode is connected with a connection point of the high-band receiving coil and the low-band receiving coil, the second end of the switching diode is grounded high-frequency-wise;
   the varactor diode is connected in parallel to the series combination of the high-band receiving coil and the low-band receiving coil, and the first end of the low-badnd receiving coil is grounded high-frequency-wise in the primary tuning circuit and the secondary tuning circuit;
   the second end of each of the switching diodes is connected DC-wise to the first band selecting terminal;
   the first end of the switching diode of one of the primary tuning circuit and the secondary tuning circuit is connected to the second band selecting terminal via a first resistor; and
   the first end of the switching diode of the other of the primary and secondary tuning circuits is connected to the second band selecting terminal DC-wise via the low-band receiving coil of the other of the primary and secondary tuning circuits, and
   wherein the first end of the switching diode in the other of the primary and secondary tuning circuits is connected to the second band selecting terminal via the low-band receiving coil and a second resistor in series.

* * * * *

UNITED STATES PATENT AND TRADEMARK OFFICE
CERTIFICATE OF CORRECTION

PATENT NO.   : 6,486,757 B2
DATED        : November 26, 2002
INVENTOR(S)  : Masaki Yamamoto et al.

It is certified that error appears in the above-identified patent and that said Letters Patent is hereby corrected as shown below:

Column 14,
Line 4, delete "low-badnd" and substitute -- low-band -- in its place.

Signed and Sealed this

Eighteenth Day of March, 2003

JAMES E. ROGAN
*Director of the United States Patent and Trademark Office*